United States Patent
Xie et al.

(10) Patent No.: US 12,106,970 B2
(45) Date of Patent: Oct. 1, 2024

(54) PATTERN SHEET, SEMICONDUCTOR INTERMEDIATE PRODUCT, AND HOLE ETCHING METHOD

(71) Applicant: BEIJING NAURA MICROELECTRONICS EQUIPMENT CO., LTD., Beijing (CN)

(72) Inventors: Qiushi Xie, Beijing (CN); Xiaoping Shi, Beijing (CN); Qingjun Zhou, Beijing (CN); Dongsan Li, Beijing (CN); Chun Wang, Beijing (CN); Yiming Zhang, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 17/919,520

(22) PCT Filed: Apr. 2, 2021

(86) PCT No.: PCT/CN2021/085171
§ 371 (c)(1),
(2) Date: Oct. 17, 2022

(87) PCT Pub. No.: WO2021/208757
PCT Pub. Date: Oct. 21, 2021

(65) Prior Publication Data
US 2024/0266182 A1    Aug. 8, 2024

(30) Foreign Application Priority Data

Apr. 17, 2020  (CN) .......................... 202010306855.2

(51) Int. Cl.
*H01L 21/308*    (2006.01)
*H01L 23/48*    (2006.01)

(52) U.S. Cl.
CPC ........ *H01L 21/3081* (2013.01); *H01L 23/481* (2013.01)

(58) Field of Classification Search
CPC .......................... H01L 21/3081; H01L 23/481
(Continued)

(56) References Cited

U.S. PATENT DOCUMENTS 7,943,520 B2    5/2011  Hirota
2004/0127055 A1    7/2004  Lee
(Continued)

FOREIGN PATENT DOCUMENTS

CN    1577763 A    2/2005
CN    102087959 A    6/2011
(Continued)

OTHER PUBLICATIONS

The World Intellectual Property Organization (WIPO) International Search Report for PCT/CN2021/085171 Jun. 29, 2021 6 Pages (including translation).

*Primary Examiner* — Caleen O Sullivan
(74) *Attorney, Agent, or Firm* — ANOVA LAW GROUP, PLLC

(57) ABSTRACT

The present disclosure discloses a pattern sheet, a semiconductor intermediate product, and a hole etching method. The pattern sheet includes a substrate, a dielectric layer, and a mask structure. The mask structure includes a multi-layer mask layer. An uppermost mask layer is a photoresist layer. A thickness of each layer of the mask layer and etching selectivity ratios between the layers below the mask layer satisfy that in each two neighboring layers of the mask layer, a lower layer of the mask layer is etched to form a through- (Continued)

hole penetrating a thickness of the lower layer of the mask layer, a remaining thickness of the upper layer of the mask layer is greater than or equal to zero.

9 Claims, 7 Drawing Sheets

(58) Field of Classification Search
USPC .......................................................... 257/618
See application file for complete search history.

(56) References Cited

U.S. PATENT DOCUMENTS

| | | | |
|---|---|---|---|
| 2012/0190204 A1 | 7/2012 | Graves-Abe et al. | |
| 2013/0143408 A1 | 6/2013 | Rantala et al. | |
| 2015/0079757 A1 | 3/2015 | Jeon et al. | |
| 2018/0108728 A1 | 4/2018 | Yoon et al. | |
| 2019/0385861 A1 | 12/2019 | Ghoneim | |
| 2021/0066123 A1 | 3/2021 | Hwang et al. | |

FOREIGN PATENT DOCUMENTS

| | | | |
|---|---|---|---|
| CN | 2012119689 | A | 7/2012 |
| CN | 102737984 | A | 10/2012 |
| CN | 102856210 | A | 1/2013 |
| CN | 103794488 | A | 5/2014 |
| CN | 104347371 | A | 2/2015 |
| CN | 105118901 | A | 12/2015 |
| CN | 205275699 | U | 6/2016 |
| CN | 106098549 | A | 11/2016 |
| CN | 108847387 | A | 11/2018 |
| CN | 110416067 | A | 11/2019 |
| CN | 111508929 | A | 8/2020 |
| JP | 2005159008 | A | 6/2005 |
| JP | 2005303292 | A | 10/2005 |
| JP | 2017112371 | A | 6/2017 |
| KR | 20150012574 | A | 2/2015 |
| KR | 20200137242 | A | 12/2020 |
| TW | 200522164 | A | 7/2005 |
| TW | 200935519 | A | 8/2009 |

PATTERN SHEET, SEMICONDUCTOR INTERMEDIATE PRODUCT, AND HOLE ETCHING METHOD

CROSS-REFERENCES TO RELATED APPLICATIONS

This application is a national phase entry under 35 U.S.C. § 371 of International Application No. PCT/CN2021/085171, filed on Apr. 2, 2021, which claims priority to Chinese Application Ser. No. 202010306855.2 filed on Apr. 17, 2020, the entire content of all of which are incorporated herein by reference.

TECHNICAL FIELD

The present disclosure generally relates to the field of semiconductor equipment, and more particularly, to a pattern sheet, semiconductor intermediate product, and hole etching method.

BACKGROUND

Affected by user requirements, integrated circuit (IC) manufacturing has shifted from two-dimensional (2D) planar integrated manufacturing technology to three-dimensional (3D) stereoscopic integrated manufacturing technology. In the 3D stereoscopic three-dimensional integrated manufacturing technology, etching technology can be used to form a through-hole between a substrate and a substrate to make the substrates vertically conductive. The substrates can be silicon substrates (wafers). Specifically, the surface of the substrates is generally provided with a complementary metal-oxide-semiconductor (hereinafter referred to as CMOS) dielectric layer. During a process of forming the through-hole, the CMOS dielectric layer needs to be etched first to form the through-hole penetrating the CMOS dielectric layer. Then, the substrate is etched to form a through-hole penetrating the substrate.

Currently, a mask used in the etching process is generally a photoresist mask. Since the photoresist mask is usually formed on a side of the CMOS dielectric layer away from the substrate, the photoresist mask has to play a mask function for the CMOS dielectric layer and the substrate. However, due to the limitation of the exposure energy and accuracy of the photolithography technology, a thickness of the photoresist mask needs to be smaller than a size of a mask opening, which causes an upper limitation for a thickness of the photoresist mask and cannot satisfy thickness requirements of the photoresist mask for a hole with a relatively small diameter (such as 2~5 μm) and a relatively large depth.

SUMMARY

The present disclosure provides a pattern sheet and a hole etching method, with which a hole with a larger depth can be formed in a substrate to meet application requirements.

In order to solve the above problems, the present disclosure adopts the following technical solutions.

Embodiments of the present disclosure provide a pattern sheet, including a substrate, and a dielectric layer and a mask structure sequentially arranged on the substrate along a direction away from the substrate. The mask structure includes a multi-layer mask layer sequentially arranged in stacks from a side of the dielectric layer away from the substrate and along a direction away from the substrate. An uppermost layer of the mask layer is a photoresist layer. A thickness of each layer of the mask layer and etching selectivity ratios between layers below the mask layer satisfy that, during a process of etching the substrate and the dielectric layer to form holes correspondingly by using the mask structure, in each two neighboring layers of the mask layer, while a lower layer of the mask layer is etched to form a through-hole penetrating a thickness of the lower layer, a remaining thickness of an upper layer of the mask layer is greater than or equal to zero, while the dielectric layer is etched to form a through-hole penetrating a thickness of the dielectric layer, a remaining thickness of all the mask layer above the dielectric layer is greater than zero, and while a hole with a set depth is formed in the substrate, the remaining thickness of all the mask layer above the dielectric layer is greater than or equal to zero.

In some embodiments, a number of layers of the mask layer is two, which are a second mask layer and a first mask layer sequentially stacked along the direction away from the substrate. The first mask layer is the photoresist layer. Respective thicknesses of the first mask layer and the second mask layer and etching selectivity ratios between layers below the mask layer satisfy the following conditions:

$$d1 \times S5 > d2, \text{ and } d2 \geq (d1 - d4/S3) \times S2/S1 + d4/S4; \text{ or}$$

$$d1 \times S5 = d2, \text{ and } d2 > (d1 - d4/S3) \times S2/S1 + d4/S4;$$

wherein, d1 denotes a thickness of the first mask layer, d2 denotes a thickness of the second mask layer, d4 denotes a thickness of the dielectric layer, S1 denotes an etching selectivity ratio of the substrate and the first mask layer, S2 denotes an etching selectivity ratio of the substrate and the second mask layer, S3 denotes an etching selectivity ratio of the dielectric layer and the first mask layer, S4 denotes an etching selectivity ratio of the dielectric layer and the second mask layer, and S5 denotes an etching selectivity ratio of the second mask layer and the first mask layer.

In some embodiments, the second mask layer includes a material containing silicon.

In some embodiments, the second mask layer is a silicon dioxide layer.

In some embodiments, a number of layers of the mask layer is three, which are a third mask layer, a second mask layer, and a first mask layer sequentially stacked along the direction away from the substrate. The first mask layer is the photoresist layer. Respective thicknesses of the first mask layer, the second mask layer, and the third mask layer and etching selectivity ratios between the layers below the mask layer satisfy the following conditions:

$$d1' \times S5' > d2', \text{ and } d2' \times S6' \geq d3', \text{ and } d3' \geq (d1' - d4'/S3') \times S2'/S1' + d4'/S4'; \text{ or}$$

$$d1' \times S5' \geq d2', \text{ and } d2' \times S6' > d3', \text{ and } d3' \geq (d1' - d4'/S3') \times S2'/S1' + d4'/S4'; \text{ or}$$

$$d1' \times S \geq d2', \text{ and } d2' \times S6' \geq d3', \text{ and } d3' > (d1' - d4'/S3') \times S2'/S1' + d4'/S4'$$

wherein, d1' denotes a thickness of the first mask layer, d2' denotes a thickness of the second mask layer, d3' denotes a thickness of the third mask layer, d4' denotes a thickness of the dielectric layer, S1' denotes an etching selectivity ratio of the substrate and the first mask layer, S2' denotes an etching selectivity ratio of the substrate and the third mask layer, S3' denotes an etching selection ratio of the dielectric layer and the first mask layer, S4' denotes an etching selectivity ratio of the dielectric layer and the third mask layer, S5' denotes an etching selectivity ratio of the second mask layer and the first mask layer, and S6' denotes an etching selectivity ratio of the third mask layer and the second mask layer.

In some embodiments, the second mask layer is a silicon dioxide layer.

In some embodiments, the third mask layer is an APFα-C layer.

In some embodiments, the thickness of the first mask layer ranges from 1 μm to 2 μm, the thickness of the second mask layer ranges from 400 nm to 700 nm, and the thickness of the third mask layer ranges from 6 μm to 7 μm.

As another technical solution, embodiments of the present disclosure provide a semiconductor intermediate product, which is formed from the pattern sheet of embodiments of the present disclosure by an etching process. The semiconductor intermediate product includes a substrate and a dielectric layer arranged on the substrate or a substrate and a dielectric layer and a remaining mask layer with at least one layer after etching arranged sequentially on the substrate along the direction away from the substrate. Through-holes penetrating thicknesses of the mask layer with the at least one layer and the dielectric layer are formed in the mask layer with the at least one layer and the dielectric layer, and a hole with a set depth is formed in the substrate.

As another technical solution, embodiments of the present disclosure provide a hole etching method. The substrate and the dielectric layer arranged on the substrate are etched to form the corresponding holes by using the pattern sheet of embodiments of the present disclosure. The hole etching method includes:

etching a lower layer of a mask layer to form a through-hole penetrating a thickness of the lower layer of the mask layer by using an upper layer of any two neighboring layers of the mask layer as a mask; and etching a dielectric layer to form a through-hole penetrating a thickness of the dielectric layer and forming a hole with a set depth in the substrate by using the remaining mask layer with at least one layer above the dielectric layer.

In some embodiments, the hole etching method is applied to a through silicon via (TSV) etching process.

The technical solutions adopted in the present disclosure can achieve the following beneficial effects.

The present disclosure provides the technical solutions for the pattern sheet, a semiconductor intermediate product, and a hole etching method. By using the mask structure of the composite film layer, that is, the multi-layer mask layer stacked sequentially from the side of the dielectric layer away from the substrate and along the direction away from the substrate, the thickness of each layer of the mask layer and the etching selectivity ratios between the layers below the mask layer satisfy that, during the process of etching the substrate and the dielectric layer to form the holes correspondingly using the mask structure, in each of the two neighboring layers of the mask layer, while the lower layer of the mask layer is etched to form the through-hole penetrating the thickness of the lower layer of the mask layer, the remaining thickness of the upper layer of the mask layer is greater than or equal to zero. While the dielectric layer is etched to form the through-hole penetrating the thickness of the dielectric layer, the remaining thickness of all the mask layer above the dielectric layer is greater than zero. While the hole with the set depth is formed in the substrate, the remaining thickness of all the mask layer above the dielectric layer is greater than or equal to zero. Thus, compared to using the photoresist mask alone in the existing technology, by using the pattern sheet of the mask structure having the composite film layer, the hole with the greater depth is formed in the substrate to satisfy the application requirements.

BRIEF DESCRIPTION OF THE DRAWINGS

The accompanying drawings described herein are used to provide further understanding of the present disclosure and constitute a part of the present disclosure. Exemplary embodiments of the present disclosure and their descriptions are used to explain the present disclosure and do not constitute an improper limitation of the present disclosure. In the accompanying drawings.

DETAILED DESCRIPTION OF THE EMBODIMENTS

Figure 1:
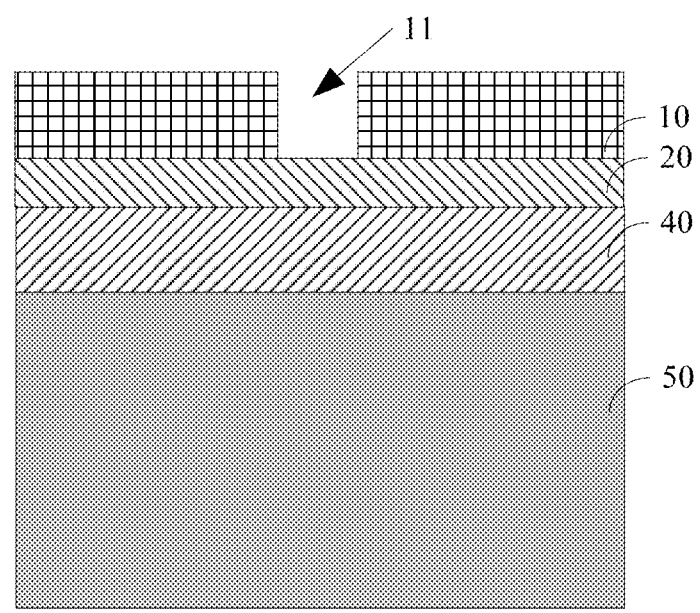
FIG. 1 is a schematic cross-section diagram of a pattern sheet according to a first embodiment of the present disclosure.

In order to make the objectives, technical solutions, and advantages of the present disclosure clearer, the technical solutions of the present disclosure will be clearly and completely described below with reference to specific embodiments of the present disclosure and the corresponding accompanying drawings. Obviously, the described embodiments are only some, but not all, embodiments of the present disclosure. Based on embodiments of the present disclosure, all other embodiments obtained by those of ordinary skill in the art without creative efforts shall fall within the protection scope of the present disclosure.

The technical solutions disclosed by embodiments of the present disclosure will be described in detail below with reference to the accompanying drawings.

The present disclosure provides a pattern sheet, which includes a substrate, and a dielectric layer and a mask structure sequentially arranged on the substrate along a direction of the substrate. A pattern consisting of holes may be formed on the dielectric layer and the substrate by performing an etching process using the mask structure. The etching process may include, for example, a through silicon via (TSV) process. The substrate may be a silicon substrate. The dielectric layer may be, for example, a CMOS dielectric layer. A CMOS circuit may be arranged on the dielectric layer.

The above-mentioned mask structure includes a multi-layer mask layer, which is arranged from a side of the dielectric layer away from the substrate and is sequentially stacked along a direction away from the substrate. An uppermost mask layer may be a photoresist layer. The photoresist layer may include a mask pattern consisting of holes. The mask pattern can be formed by exposure. The holes in the mask pattern can be circular holes. Radii of the holes can be determined according to actual needs. Of course, the holes can also be set to holes with any other shapes. In addition, by changing exposure energy, a through-hole penetrating the thickness of the mask layer can be formed in the uppermost mask layer whose thickness satisfies the requirements. In a process of performing the etching process using the mask structure, at least one layer of the mask layer can be etched located below the mask layer using the uppermost mask layer as the mask. It should be noted that, before the above-mentioned etching process is performed, no pattern corresponding to the above-mentioned mask pattern may be formed on other film layers except the photoresist layer.

Moreover, a thickness of each layer of the mask layer and an etching selectivity ratio between the layers below the mask layer may satisfy that, in an etching process of forming the hole in the substrate and the dielectric layer using the above mask structure correspondingly, in each of two neighboring layers of the mask layer, while a lower portion of the mask layer is etched to form a through-hole penetrating a thickness of the lower portion, the remaining thickness of an upper portion of the mask layer may be greater than or equal to zero. While the dielectric layer is etched to form a through-hole penetrating the thickness of the dielectric layer, the remaining thicknesses of all mask layers above the dielectric layer may be greater than zero. While a hole with a set depth is formed in the substrate, the remaining thicknesses of all mask layers above the dielectric layer are greater than or equal to zero. That is, each layer of the mask layer can be used as a mask for etching a lower layer neighboring to the layer of the mask layer to form the through-hole. When the substrate is etched, a sum of the remaining thickness of all mask layers above the dielectric layer is large enough to cause the hole formed in the substrate to reach the set depth.

As can be seen from the above, compared with using the photoresist mask alone in the existing technology, using the pattern sheet with the above-mentioned mask structure with the multi-film layers, a hole with a larger depth can be formed on the substrate to meet the usage requirements.

A specific implementation of the above-mentioned pattern sheet will be described in detail below.

First Embodiment

Figure 2A:
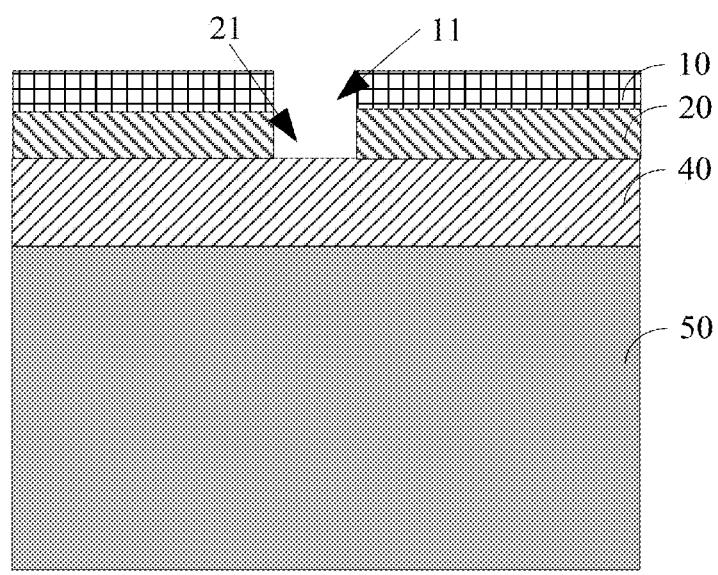
FIG. 2A is a schematic cross-section diagram showing a pattern sheet after a second mask layer is etched to form a through-hole according to a first embodiment of the present disclosure.

Referring to FIG. 1, the pattern sheet of the present embodiment includes a substrate 50, and a dielectric layer 40 and a mask structure sequentially arranged on the substrate 50 along a direction away from the substrate 50. In the mask structure, the mask layer includes two layers, which are a second mask layer 20 and a first mask layer 10 which are stacked in sequence along the direction away from the substrate 50. The first mask layer 10 may be a photoresist layer, and the photoresist layer has a mask pattern composed of a hole 11. In addition, the first mask layer 10 may be used as a mask for etching a through-hole in the second mask layer 20. A through-hole 21 formed in the second mask layer 20 is shown in FIG. 2A. In the present embodiment, while the second mask layer 20 is etched to form the through-hole 21 penetrating the thickness of the second mask layer 20, the remaining thickness of the first mask layer 10 may be greater than zero. That is, when the through-hole 21 is formed, a certain thickness of the first mask layer 10 may not be consumed. The thickness of the second mask layer 20 may be unchanged. In this situation, when the dielectric layer 40 is etched, the remaining first mask layer 10 and the second mask layer 20 may both be used as masks for etching a through-hole in the dielectric layer 40.

Of course, in other embodiments of the present disclosure, the first mask layer 10 may be completely consumed while the second mask layer 20 is etched to form the through-hole 21 penetrating the thickness of the second mask layer 20, and the second mask layer 20 may still remain unchanged. In this case, when the dielectric layer 40 is etched, only the second mask layer 20 may be used as a mask for etching the through-hole in the dielectric layer 40.

Figure 2B:
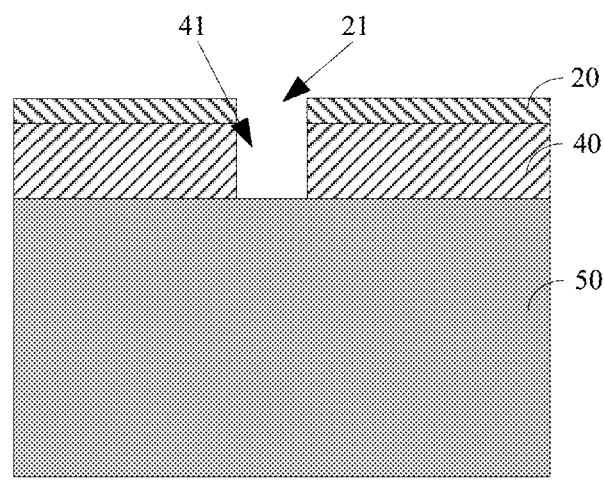
FIG. 2B is a schematic cross-section diagram showing a pattern sheet after a dielectric layer is etched to form a through-hole according to a first embodiment of the present disclosure.

As shown in FIG. 2B, before the dielectric layer 40 is etched to form the through-hole 41 penetrating the thickness of the dielectric layer 40, the first mask layer 10 is completely consumed. While the dielectric layer 40 is etched to form the through-hole 41 penetrating the thickness of the dielectric layer 40, the remaining thickness of the second mask layer 20 may be greater than zero. That is, when the through-hole 41 is formed, a certain thickness of the second mask layer 20 may still not be consumed. In this situation, when the substrate 50 is etched, the remaining second mask layer 20 may be used as a mask for etching a hole in the substrate 50.

Of course, in other embodiments of the present disclosure, while the dielectric layer 40 is etched to form the through-hole 41 penetrating the thickness of the dielectric layer 40, the remaining thickness of the first mask layer 10 may also be greater than zero. In this situation, when the substrate 50 is etched, the remaining first mask layer 10 and the second mask layer 20 may both be used as the masks for etching the hole in the substrate 50.

Figure 2C:
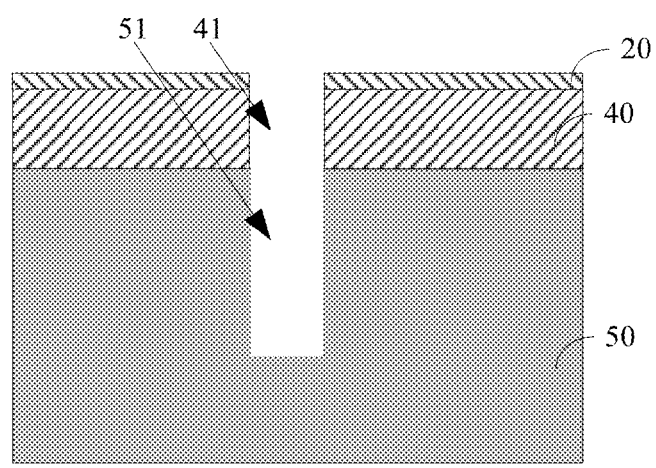
FIG. 2C is a schematic cross-section diagram of a semiconductor intermediate product according to a first embodiment of the present disclosure.

As shown in FIG. 2C, while the hole 51 with the set depth is formed by etching in the substrate 50, the remaining thickness of the second mask layer 20 is greater than zero. Thus, while the hole with the set depth is formed in the substrate 50, a certain thickness of the second mask layer 20 may still remain to prevent the dielectric layer 40 from being etched to ensure that the dielectric layer is not damaged and has complete performance. Of course, in other embodiments of the present disclosure, while the hole 51 with the set depth is formed by etching in the substrate 50, the remaining thickness of the second mask layer 20 may also be equal to zero. That is, the second mask layer 20 may be completely consumed. In addition, the hole 51 with the set depth formed by etching in the substrate 50 may be a blind hole with a depth smaller than the thickness of the substrate 50 or may be a through-hole penetrating the thickness of the substrate 50.

Based on the above embodiment, in some embodiments, the second mask layer 20 includes a material containing silicon. The silicon has good semiconductor properties, is easy to obtain, and has a low cost. Thus, the processing difficulty and processing cost may be reduced. In addition, in the process of performing the etching on the substrate using the second mask layer 20 as a mask, many materials may be used to etch the second mask layer 20 and the substrate, which is beneficial to form a hole with a relatively large depth in the substrate. In addition, in the situation that the second mask layer 20 includes a material containing silicon, etching may be performed on the dielectric layer 40 and the substrate 50 in sequence by fluorine-containing plasma. The second mask layer 20 may be used as the mask for etching the dielectric layer 40 and the substrate 50, which facilitates the formation of the holes penetrating the respective thicknesses of the substrate 50 and the dielectric layer 40.

Further, in some embodiments, the second mask layer 20 may be a silicon dioxide layer, which can further reduce the material cost and processing difficulty of the second mask layer 20 and improve product competitiveness.

In addition, the respective thicknesses of the first mask layer 10 and the second mask layer 20 and the etching selectivity ratio between the layers below each satisfy the following conditions:

$$d1 \times S5 > d2, \text{ and } d2 \geq (d1 - d4/S3) \times S2/S1 + d4/S4; \text{ or,}$$

$$d1 \times S5 = d2, \text{ and } d2 > (d1 - d4/S3) \times S2/S1 + d4/S4,$$

where d1 denotes a thickness of the first mask layer 10, d2 denotes a thickness of the second mask layer 20, d4 denotes a thickness of the dielectric layer 40, S1 denotes an etching selectivity ratio between the substrate 50 and the first mask layer 10, S2 denotes an etching selectivity ratio between the substrate 50 and the second mask layer 20, S3 denotes an etching selectivity ratio between the dielectric layer 40 and the first mask layer 10, S4 denotes an etching selectivity ratio between the dielectric layer 40 and the second mask layer 20, and S5 denotes an etching selectivity ratio between the second mask layer 20 and the first mask layer 10.

It should be noted that the etching selectivity ratio may be used to indicate a relative etching rate of one material relative to another material under the same etching condition. For example, etching selectivity ratio S1 between the substrate 50 and the first mask layer 10 may indicate a ratio of an etching rate of the substrate 50 to an etching rate of the first mask layer 10 under the same etching condition, when the first mask layer 10 is used as a mask, and the substrate 50 is used as the material to be etched.

By making the respective thicknesses of the first mask layer 10 and the second mask layer 20 and the etching selectivity ratio between the layers below each satisfy the above conditions, a portion of the first mask layer 10 and the second mask layer 20 can be used as a mask for etching the dielectric layer 40 (or etching the dielectric layer 40 and the substrate 50). With the mask structure of the composite film layer compared to using the photoresist alone as the mask structure of the dielectric layer and the substrate, a hole with larger depth may be formed on the substrate to satisfy application needs.

In detail, the meaning represented by d1×S5 is that while the first mask layer 10 with a thickness of d1 is completely consumed, the thickness of the second mask layer 20 is consumed by dx. When dx is equal to d2, it can be considered that while the first mask layer 10 with the thickness of d1 is completely consumed, the second mask layer with the thickness of d2 may be also completely consumed. Based on this, by causing d1×S5 to be equal to d2, during a process of etching the second mask layer 20 using the first mask layer 10, when the first mask layer with the thickness d1 is completely consumed, a through-hole 21 penetrating the thickness of the second mask layer 20 may be just formed. It is easy to understand that the pattern including the through-hole 21 formed on the second mask layer 20 is consistent with the mask pattern including the hole 11 on the first mask layer 10. The position of the through-hole 21 may correspond to the position of the hole 11. Obviously, when d1×S5 is greater than d2, it can be considered that in the process of etching the second mask layer 20 by using the first mask layer 10 as a mask, while the through-hole 21 penetrating the thickness of the second mask layer 20 is formed on the second mask layer 20, the first mask layer 10 with the thickness of d1 still remains. Thus, during the process of etching the dielectric layer 40 (or the dielectric layer 40 and the substrate 50), the remaining portions of the second mask layer 20 and the first mask layer 10 may be used as the mask.

d2=(d1−d4/S3)×S2/S1+d4/S4, that is, it can be deduced as d2−d4/S4−(d1−d4/S3)×S2/S1, or it can be further deduced as (d2−d4/S4)/S2=(d1−d4/S3)/S1.

In the above equation (d2−d4/S4)/S2=(d1−d4/S3)/S1, d4/S4 may indicate that in the process of etching the dielectric layer 40 by using the second mask layer 20 as the mask, the thickness of the second mask layer 20 may need to be consumed when the through-hole 41 penetrating the thickness of the dielectric layer 40 is formed in the dielectric layer 40 with the thickness of d4. Further, d2−d4/S4 may indicate the remaining thickness of the second mask layer 20 when the through-hole 41 penetrating the thickness of the dielectric layer 40 is just formed in the dielectric layer 40 with the thickness of d4. Furthermore, (d2−d4/S4)/S2 may indicate the depth of the hole formed in the substrate 50 in the process of etching the substrate 50 using the second mask layer 20 as the mask when the second mask layer 20 with the thickness of d2−d4/S4 is just completely consumed.

Similarly, d1−d4/S3 may indicate a remaining thickness of the first mask layer 10 in the process of etching the dielectric layer 40 by using the first mask layer 10 as the mask, when the through-hole 41 penetrating the thickness of the dielectric layer 40 is just formed in the dielectric layer 40 with the thickness of d4. Further, (d1−d4/S3)/S1 may indicate a depth of the hole formed in the substrate 50 in the process of etching the substrate 50 by using the first mask layer 10 as the mask when the first mask layer 10 with the thickness of d1−d4/S3 is just completely consumed.

Obviously, when (d2−d4/S4)/S2 is equal to (d1−d4/S3)/S1, it can be considered that the dielectric layer 40 and the substrate 50 may be etched only by using the second mask layer 20 as the mask compared to etching the dielectric layer 40 and the substrate 50 only by using the first mask layer 10 as the mask, the depths of the holes formed in the substrate 50 by the two may be equal. When (d2−d4/S4)/S2 is greater than (d1−d4/S3)/S1, that is, d2 is greater than (d1−d4/S3)× S2/S1+d4/S4, the depth of the hole eventually formed in the substrate 50 by only using the second mask layer 20 as the mask may be greater than the depth of the hole eventually formed in the substrate 50 by only using the first mask layer 10 as the mask.

Therefore, when the respective thicknesses of the first mask layer 10 and the second mask layer 20 and the etching selectivity ratios between the layers below each satisfy the conditions of d1×S5>d2 and d2>(d1−d4/S3)×S2/S1+d4/S4, in the process of etching the dielectric layer 40 (or the dielectric layer 40 and the substrate 50), the dielectric layer 40 may be etched using the remaining portions of the second mask layer 20 and the first mask 10 as the mask. Compared to etching the dielectric layer 40 and the substrate 50 only using the first mask layer 10 as the mask, the hole with a greater depth may be formed in the substrate 50 to satisfy the application needs. When the respective thicknesses of the first mask layer 10 and the second mask layer 20 and the etching selectivity ratios of the layers below each satisfy the conditions of d1×S5=d2 and d2>(d1−d4/S3)×S2/S1+d4/S4, as mentioned above, the depth of the hole eventually formed in the substrate 50 by only using the second mask layer 20 as the mask may be greater than the depth of the hole eventually formed in the substrate 50 by only using the first mask layer 10 as the mask to satisfy the application requirements.

Second Embodiment

Figure 3:
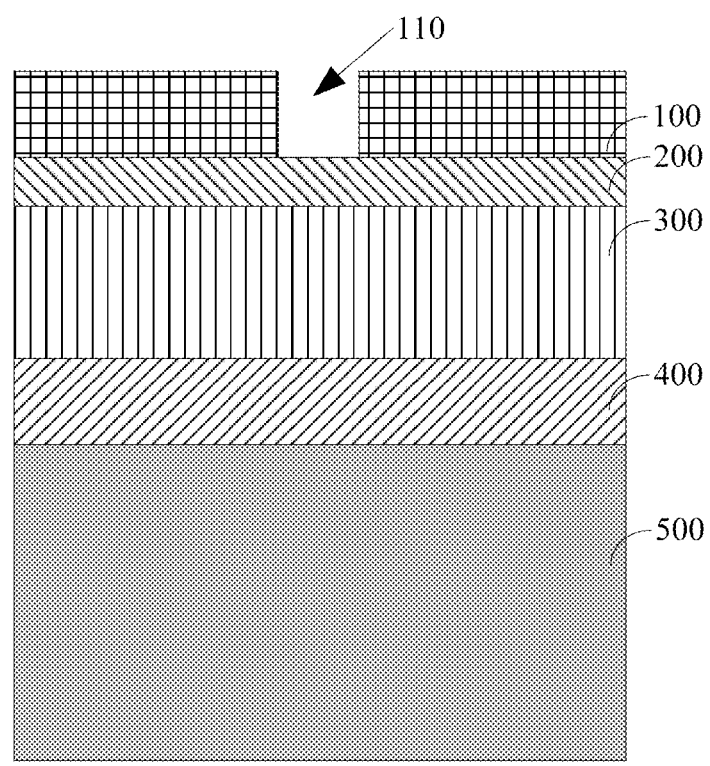
FIG. 3 is a schematic cross-section diagram of a pattern sheet according to a second embodiment of the present disclosure.
Figure 4A:
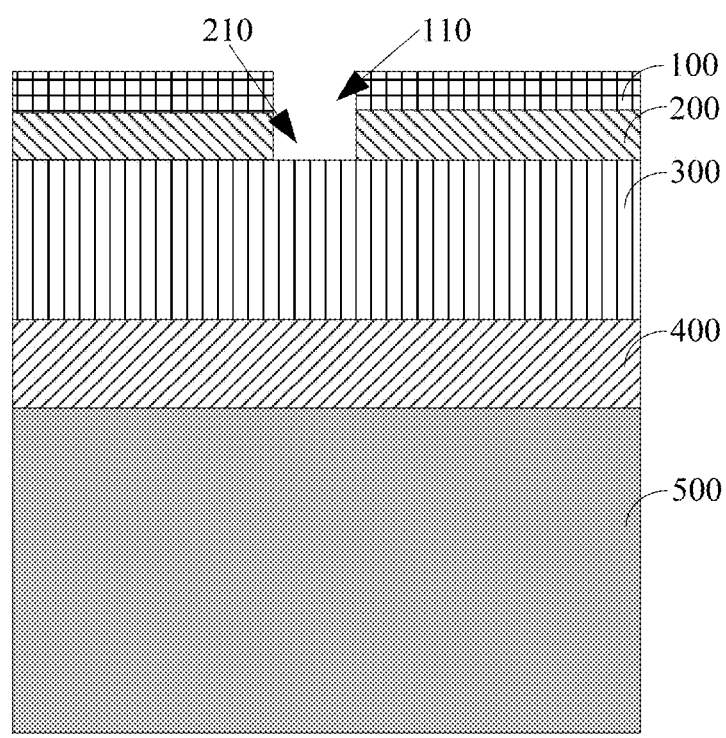
FIG. 4A is a schematic cross-section diagram of a pattern sheet after a second mask layer is etched to form a through-hole according to a second embodiment of the present disclosure.

Referring to FIG. 3, the pattern sheet of the present embodiment includes a substrate 500, and a dielectric layer 400 and a mask structure sequentially arranged on the substrate 500 along a direction of the substrate 500. In the mask structure, the mask layers may include three layers, which are a third mask layer 300, a second mask layer 200, and a first mask layer 100 sequentially stacked along a direction away from the substrate 500. The first mask layer 100 may be a photoresist layer. The photoresist layer may have a mask pattern composed of holes 110. In addition, the first mask layer 100 may be used as a mask for etching a through-hole in the second mask layer 200. The through-hole 210 formed in the second mask layer 200 are shown in FIG. 4A. In the present embodiment, while the second mask layer 200 is etched to form the through-hole 210 penetrating the thickness of the second mask layer 200, the remaining thickness of the first mask layer 100 may be greater than zero. That is, when the through-hole 210 is formed, a certain thickness of the first mask layer 100 may still not be consumed, and the thickness of the second mask layer 200 may not be changed. In this situation, when the third mask layer 300 is etched, the remaining first mask layer 100 and the second mask layer 200 both may be used as masks for etching a through-hole in the third mask layer 300.

Of course, in other embodiments of the present disclosure, the first mask layer 100 may be completely consumed while the second mask layer 200 is etched to form the through-hole 210 penetrating the thickness of the second mask layer 200, and the thickness of the second mask layer 200 may still be unchanged. In this situation, when the third mask layer 300 is etched, only the second mask layer 200 may be used as a mask for etching through-hole in the third mask layer 300.

Figure 4B:
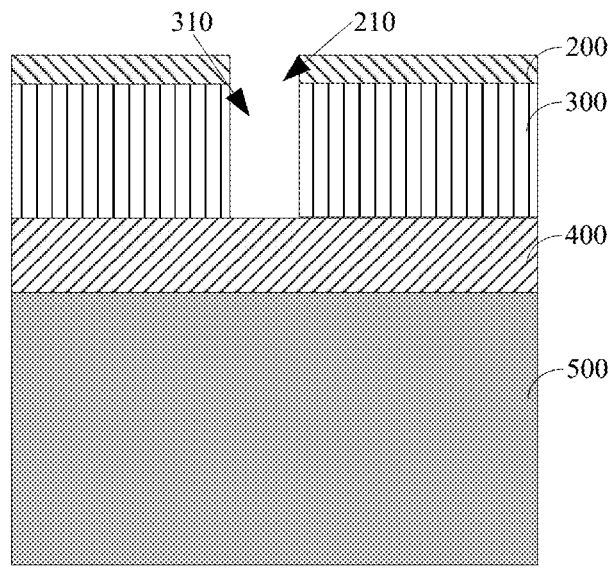
FIG. 4B is a schematic cross-section diagram of a pattern sheet after a third mask layer is etched to form a through-hole according to a second embodiment of the present disclosure.

As shown in FIG. 4B, before the third mask layer 300 is etched to form the through-hole 310 penetrating the thickness of the third mask layer 300, the first mask layer 100 is completely consumed. While the third mask layer 300 is etched to form the through-hole 310 penetrating the thickness of the third mask layer 300, the remaining thickness of the second mask layer 200 may be greater than zero. That is, when the through-hole 310 is formed, a certain thickness of the second mask layer 200 may still not be consumed. In this situation, when the dielectric layer 400 is etched, the remaining second mask layer 200 and the third mask layer 300 together may be used as masks for etching the through-hole in the dielectric layer 400.

Of course, in other embodiments of the present disclosure, while the third mask layer 300 is etched to form the through-hole 310 penetrating the thickness of the third mask layer 300, the remaining thickness of the second mask layer 200 may also be equal to zero. In this situation, when the dielectric layer 400 is etched, only the third mask layer 300 may be used as a mask for etching the through-hole in the dielectric layer 400.

Figure 4C:
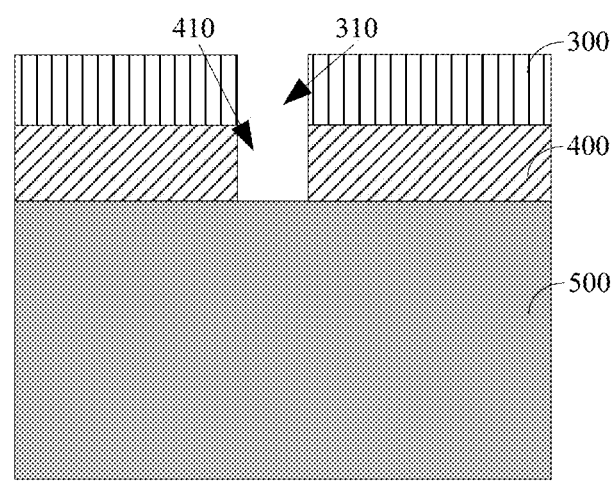
FIG. 4C is a schematic cross-section diagram of a pattern sheet after a dielectric layer is etched to form a through-hole according to a second embodiment of the present disclosure.

As shown in FIG. 4C, before the dielectric layer 400 is etched to form the through-hole 410 penetrating the thickness of the dielectric layer 400, the second mask layer 200 may be completely consumed. While the dielectric layer 400 is etched to form the through-hole 410 penetrating the thickness of the dielectric layer 400, the remaining thickness of the third mask layer 300 may be greater than zero. That is, when the through-hole 410 is formed, a certain thickness of the third mask layer 300 may still not be consumed. In this situation, when the substrate 500 is etched, the remaining third mask layer 300 may be used as a mask for etching the hole in the substrate 500.

Of course, in other embodiments of the present disclosure, while the dielectric layer 400 is etched to form the through-hole 410 penetrating the thickness of the dielectric layer 400, the remaining thickness of the second mask layer 200 may also be greater than zero. In this situation, when the substrate 500 is etched, the remaining second mask layer 200 and the third mask layer 300 may together be used as a mask for etching the hole in the substrate 500.

Figure 4D:
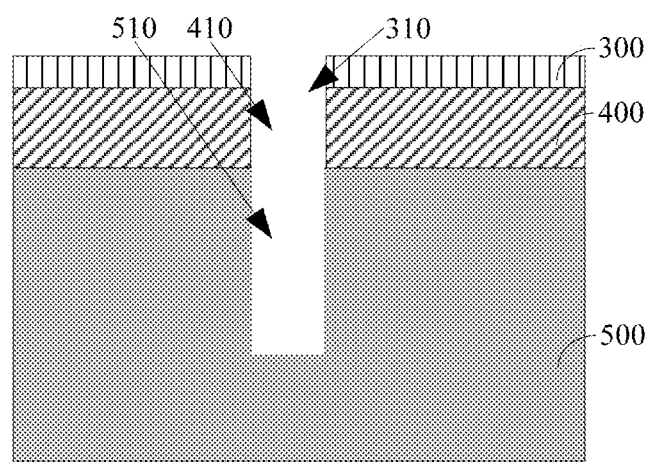
FIG. 4D is a schematic cross-section diagram of a semiconductor intermediate product according to a second embodiment of the present disclosure.

As shown in FIG. 4D, while the substrate 500 is etched to form the hole 510 of the set depth, the remaining thickness of the third mask layer 300 may be greater than zero. Thus, while the hole of the set depth is formed in the substrate 500, a certain thickness of the third mask layer 300 may remain to prevent the dielectric layer 400 from being etched to ensure that the dielectric layer is not damaged and has complete performance. Of course, in other embodiments of the present disclosure, while the substrate 500 is etched to form the hole 510 with the set depth, the remaining thickness of the third mask layer 300 may also be equal to zero. That is, the third mask layer 300 may be completely consumed. In addition, the hole 510 of the set depth formed by etching the substrate 500 may be a blind hole with a depth smaller than the thickness of the substrate 500 or a through-hole penetrating the thickness of the substrate 500.

The second mask layer 200 may include a material containing silicon, which has a good semiconductor property, is easy to obtain, and has low cost. Thus, processing difficulty and processing cost may be reduced. Moreover, when the substrate is etched using the second mask layer 200 as a mask, many materials can be used to etch the substrate and the second mask layer 200 simultaneously, which facilitates forming a hole with a greater depth in the substrate. In addition, in the situation that the second mask layer 200 includes the material containing silicon, the dielectric layer 400 and the substrate 500 may be etched sequentially by a fluorine-containing plasma. The dielectric layer 400 and the substrate 500 may be etched using the second mask layer 200 as a mask, which facilitates forming the through-holes penetrating the thicknesses of the dielectric layer 400 and the substrate 500 in the substrate 500 and dielectric layer 400.

Further, in some embodiments, the second mask layer 200 may be a silicon dioxide layer, which can further reduce the material cost and processing difficulty of the second mask layer 200 and improve product competitiveness.

In some embodiments, the third mask layer 300 may be an APFα-C layer. In the situation that the third mask layer 300 is the APFα-C layer, the dielectric layer 400 and the substrate 500 can be etched sequentially by an oxygen-containing plasma. The dielectric layer 400 and the substrate 500 may be etched using the third mask layer 300 as the mask, which facilitates forming the through-holes penetrating the respective thicknesses of the substrate 500 and the dielectric layer 400 in the substrate 500 and the dielectric layer 400.

In some embodiments, the thickness of the first mask layer 100 may range from 1 μm to 2 μm. The thickness of the second mask layer 200 may range from 400 nm to 700 nm. The thickness of the third mask layer 300 may range from 6 μm to 7 μm. Within these thickness ranges, the hole with greater depth can be formed on the substrate to meet the application requirements.

In addition, the respective thicknesses of the first mask layer 100, the second mask layer 200, and the third mask layer 300, and the etching selectivity ratios between the layers below each satisfy the following conditions:

$d1' \times S5' > d2'$, and $d2' \times S6' \geq$ $d3'$, and $d3' \geq (d1' - d4'/S3') \times S2'/S1' + d4'/S4'$; or, $d1' \times S5' \geq d2'$, and $d2' \times S6' >$ $d3'$, and $d3' \geq (d1' - d4'/S3') \times S2'/S1' + d4'/S4'$; or, $d1' \times S \geq d2'$, and $d2' \times S6' \geq$ $d3'$, and $d3' > (d1' - d4'/S3') \times S2'/S1' + d4'/S4'$;

wherein, d1' denotes the thickness of the first mask layer 100, d2' denotes the thickness of the second mask layer 200, d3' denotes the thickness of the third mask layer 300, d4' denotes the thickness of the dielectric layer 400, S1' denotes the etching selectivity ratio between the substrate 500 and the first mask layer 100, S2' denotes the etching selectivity ratio between the substrate 500 and the third mask layer 300, S3' denotes the etching selectivity ratio between the dielectric layer 400 and the first mask layer 100, S4' denotes the etching selectivity ratio between the dielectric layer 400 and the third mask layer 300, S5' denotes the etching selectivity ratio between the second mask layer 200 and the first mask layer 100, and S6' denotes the etching selectivity ratio between the third mask layer 300 and the second mask layer 200.

By making the respective thicknesses of the first mask layer 100, the second mask layer 200, and the third mask layer 300, and the etching selectivity ratios between the layers below the first mask layer 100, the second mask layer 200, and the third mask layer 300 satisfy the above conditions, the third mask layer 300 (or a portion of the first mask layer 100, the second mask layer 200, and the third mask layer 300, or a portion of the second mask layer 200 and the third mask layer 300) can be ensured to be used as the mask for etching the dielectric layer 400 and the substrate 500. The pattern sheet of the composite film layer can be used to form the hole with the greater depth on the substrate compared to using the photoresist alone as the pattern sheet of the dielectric layer and the substrate to meet the application requirements.

In detail, the meaning represented by d1'×S5' may indicate that while the first mask layer 100 with the thickness of d1' is completely consumed, the thickness of the second mask layer 200 is dx. When dx is equal to d2', it can be considered that while the first mask layer 100 with the thickness of d1' is completely consumed, the second mask layer 200 with the thickness of d2' may be also just completely consumed. Based on this, by cause d1'×S5' to be equal to d2', during the process of etching the second mask layer 200 using the first mask layer 100 as the mask, when the first mask layer 100 with the thickness of d1' is completely consumed, the through-hole 210 penetrating the thickness of the second mask layer 200 may be just formed. It is easy to understand that the pattern including the through-hole 210 that is formed on the second mask layer 200 may be eventually caused to be consistent with the mask pattern including the hole 110 on the first mask layer 100. The position of the through 210 may correspond to the position of the hole 110. Obviously, when d1'×S5' is greater than d2', it can be considered that during the process of etching the second mask layer 200 using the first mask layer 100 as the mask, while the through-hole 210 penetrating the thickness of the second mask layer 200 is formed on the second mask layer 200, the first mask layer 100 with the thickness of d1' may still remain. Thus, during the process of etching the dielectric layer 400 and the substrate 500, the second mask layer 200 and the remaining portion of the first mask layer 100 may be used as the mask together.

The meaning represented by d2'×S6' may include that while the second mask layer 200 with the thickness of d2' is completely consumed, the thickness of the third mask layer 300 may have the thickness of dy. When dy is equal to d3', the second mask layer 200 with the thickness of d2' while the third mask layer 300 with the thickness of d3' may also be just completely consumed. Based on this, by causing d2'×S6' to be equal to d3', during the process of etching the third mask layer 300 using the second mask layer 200 as the mask, when the second mask layer 200 with the thickness of d2' is also just completely consumed, the through-hole 310 penetrating the thickness of the third mask layer 300 may just be formed on the third mask layer 300. It can be easily understood that the position of the through-hole 310, the position of the through-hole 210, and the position of the hole 110 may correspond to each other by eventually causing the pattern including the through-hole 310 formed on the third mask layer 300 to be consistent with the mask pattern including the hole 110 on the first mask layer 100. Obviously, when d2'×S6'>d3', it can be considered that in the process of etching the third mask layer 300 by using the second mask layer 200 as the mask, when the through-hole 310 penetrating the thickness of the third mask layer 300 is just formed on the third mask layer 300, the second mask layer 200 with a thickness of d2' may still remain. Thus, during the process of etching the dielectric layer 400 and the substrate 500, the third mask layer 300 and a portion of the remaining second mask layer 200 may be used as the mask.

d3'=(d1'−d4'/S3')×S2'/S1'+d4'/S4', which can be derived as d3'−d4'/S4'=(d1'−d4'/S3')×S2 '/S1', and can also be further derived as (d3'−d4'/S4')/S2'=(d1'−d4'/S3')/S1'.

In the above equation (d3'−d4'/S4')/S2'=(d1'−d4'/S3')/S1', d4'/S4' may represent that during the process of etching the dielectric layer 400 using the third mask layer 300 as the mask, when the through-hole 410 penetrating the thickness of the dielectric layer 400 is just formed in the dielectric layer 400 with the thickness of d4', the thickness of the third mask layer 300 may need to be consumed. Further, d3'−d4'/S4' may represent the remaining thickness of the third mask layer 300 when the through-hole 410 penetrating the thickness of the dielectric layer 400 is just formed in the dielectric layer 400 with the thickness of d4'. Further more, (d3'−d4'/S4')/S2' may represent a depth of the hole formed in the substrate 500 when the third mask layer 300 with the thickness of d3'–d4'/S4' is just completely consumed during the process of etching the substrate 500 by using the third mask layer 300 as the mask.

Similarly, d1'–d4'/S3' may represent the remaining thickness of the first mask layer 100 when the through-hole 410 penetrating the thickness of the dielectric layer 400 is just formed in the dielectric layer with the thickness of d4' during the process of etching the dielectric layer using the first mask layer 100 as the mask. Further, (d1'–d4'/S3')/S1' may represent the depth of the hole formed in the substrate 500 when the first mask layer 100 with the thickness of d1'-d4'/S3' is just completely consumed during the process of etching the substrate 500 by using the first mask layer 100 as the mask.

Obviously, when (d3'–d4'/S4')/S2'=(d1'–d4'/S3')/S1', it can be considered that, by comparing etching the dielectric layer 400 and the substrate 500 only using the third mask layer 300 as the mask to etching the dielectric layer 400 and the substrate 500 only using the first mask layer 100, the depths of the holes formed in the substrate 500 may be equal to each other. When (d3'–d4'/S4')/S2'>(d1'–d4'/S3')/S1', that is, d3'>(d1'–d4'/S3')>S2'/S1'+d4'/S4', the depth of the hole eventually formed in the substrate 500 by only using the third mask layer 300 as the mask may be greater than the depth of the hole formed in the substrate 500 by using only the first mask layer 100 as the mask.

It can be seen from the above that, similar to the above-mentioned first embodiment, when the respective thicknesses of the first mask layer 100, the second mask layer 200, and the third mask layer 300, and the etching selectivity ratios between the layers below them satisfy the above conditions, the hole with a greater depth may have to be formed in the substrate 500 to satisfy the application requirements by comparing to etching the dielectric layer 400 and the substrate 500 only using the first mask layer 100 as the mask.

Third Embodiment

The present embodiment provides a semiconductor intermediate product, which is formed by using an etching process on the pattern sheet of the above-mentioned embodiments of the present disclosure. Specifically, the semiconductor intermediate product may include a substrate and a dielectric layer arranged on the substrate. The through-hole penetrating the thickness of the dielectric layer may be formed in the dielectric layer. The hole with the set depth corresponding to the through-hole may be formed in the substrate. While the substrate is etched to form the hole with the set depth, the remaining thickness of the mask layer located above the dielectric layer may be equal to zero, that is, may be completely consumed. In addition, the hole with the set depth formed in the substrate may be a blind-hole with the depth smaller than the thickness of the substrate or the through-hole penetrating the thickness of the substrate.

Alternatively, the semiconductor intermediate product may further include a substrate, and a dielectric layer and a remaining mask layer of at least one layer after etching arranged on the substrate in sequence along a direction away from the substrate. Through-holes penetrating the thicknesses of the at least one layer of the mask layer and the dielectric layer may be formed correspondingly in the at least one layer of the mask layer and the dielectric layer. A hole with a set depth corresponding to the through-holes may be formed in the substrate. In the process of performing the etching process using the above-mentioned pattern sheet of embodiments of the present disclosure, while the substrate is etched to form the hole with the set depth, the remaining thickness of the mask layer above the dielectric layer may be greater than zero. Thus, while the hole with the set depth is formed in the substrate, the mask layer with a certain thickness may still remain, which can prevent the dielectric layer from being etched to ensure that the dielectric layer is not damaged and has complete performance. For example, FIG. 2C and FIG. 4D shows two semiconductor intermediate products, respectively, which retain the mask layer with the certain thickness while the hole with the set depth is formed in the substrate.

Fourth Embodiment

This embodiment provides a hole etching method, which uses the pattern sheets provided by the above-mentioned embodiments of the present disclosure to etch the substrate and the dielectric layer arranged on the substrate to form corresponding holes. The hole etching method includes:

etching a lower layer of the mask layer to form a through-hole penetrating a thickness of the lower layer of the mask layer by using an upper layer of the mask layer of any two neighboring layers of the mask layer as a mask; and etching the dielectric layer to form a through-hole penetrating the thickness of the dielectric layer and forming a hole with a set depth in the substrate by using the remaining mask layer of at least one layer above the dielectric layer.

In some embodiments, the hole etching method provided by the embodiment may be applied to a through silicon vias (TSV) etching process to further reduce the processing difficulty and improve the processing efficiency.

In summary, in the technical solutions of the above-mentioned pattern sheet, semiconductor intermediate product, and hole etching method of embodiments of the present disclosure, by using the mask structure with the composite film layers, that is, a multi-layer mask layer arranged in stacks sequentially from the side of the dielectric layer away from the substrate and along the direction away from the substrate, the thicknesses of the layers of the mask layer and the etching selectivity ratios between the layers below the mask layer satisfy that, during the process of etching the substrate and the dielectric layer to form holes correspondingly by using the mask structure, in each two neighboring layers of the mask layer, while the lower layer of the mask layer is etched to form a through-hole penetrating the thickness of the lower layer of the mask layer, the remaining thickness of the upper layer of the mask layer may be greater than or equal to zero, and while the dielectric layer is etched to form the through-hole penetrating the thickness of the dielectric layer, a sum of the remaining thicknesses of all the layers of the mask layer above the dielectric layer may be greater than or equal to the set depth of the hole formed in the substrate. Thus, compared to using the photoresist mask alone in the existing technology, by using the pattern sheet of the above mask structure of the composite film layer, the hole with a greater depth may be formed in the substrate, which satisfies the application requirements.

The above embodiments of the present disclosure mainly describe the differences between the embodiments. As long as the different optimization features of the embodiments are not contradictory, the optimization features can be combined to form better embodiments, which is not repeated here for brevity of the text.

The above descriptions are merely embodiments of the present disclosure and are not intended to limit the present disclosure. Various modifications and variations of the present disclosure may be made for those skilled in the art. Any modifications, equivalent replacements, improvements, etc., made within the spirit and principle of the present disclosure shall be included within the scope of the claims of the present application.

What is claimed is:

1. A pattern sheet, comprising a first mask layer, a second mask layer, a dielectric layer, and a substrate sequentially arranged in stacks from top to bottom, wherein:

the first mask layer includes a first hole penetrating the first mask layer along a thickness direction of the first mask layer and satisfies:

$$d1 \times S5 > d2, \text{ and } d2 \geq (d1 - d4/S3) \times S2/S1 + d4/S4; \text{ or}$$
$$d1 \times S5 = d2, \text{ and } d2 > (d1 - d4/S3) \times S2/S1 + d4/S4;$$

wherein, d1 denotes a thickness of the first mask layer, d2 denotes a thickness of the second mask layer, d4 denotes a thickness of the dielectric layer, S1 denotes an etching selectivity ratio of the substrate and the first mask layer, S2 denotes an etching selectivity ratio of the substrate and the second mask layer, S3 denotes an etching selectivity ratio of the dielectric layer and the first mask layer, S4 denotes an etching selectivity ratio of the dielectric layer and the second mask layer, and S5 denotes an etching selectivity ratio of the second mask layer and the first mask layer.

2. The pattern sheet according to claim 1, wherein the second mask layer includes a material containing silicon.

3. The pattern sheet according to claim 2, wherein the second mask layer is a silicon dioxide layer.

4. A pattern sheet comprising a first mask layer, a second mask layer, a third mask layer, a dielectric layer, and a substrate sequentially arranged in stacks from top to bottom, wherein:

the first mask layer is a photoresist layer and includes a first hole penetrating the first mask layer along a thickness direction of the first mask layer and satisfies:

$$d1' \times S5' > d2', \text{ and } d2' \times S6' \geq$$
$$d3', \text{ and } d3' \geq (d1' - d4'/S3') \times S2'/S1' + d4'/S4'; \text{ or}$$
$$d1' \times S5' \geq d2', \text{ and } d2' \times S6' >$$
$$d3', \text{ and } d3' \geq (d1' - d4'/S3') \times S2'/S1' + d4'/S4'; \text{ or}$$
$$d1' \times S \geq d2', \text{ and } d2' \times S6' \geq$$
$$d3', \text{ and } d3' > (d1' - d4'/S3') \times S2'/S1' + d4'/S4';$$

wherein, d1' denotes a thickness of the first mask layer, d2' denotes a thickness of the second mask layer, d3' denotes a thickness of the third mask layer, d4' denotes a thickness of the dielectric layer, S1' denotes an etching selectivity ratio of the substrate and the first mask layer, S2' denotes an the etching selectivity ratio of the substrate and the third mask layer, S3' denotes an etching selection ratio of the dielectric layer and the first mask layer, S4' denotes an etching selectivity ratio of the dielectric layer and the third mask layer, S5' denotes an etching selectivity ratio of the second mask layer and the first mask layer, and S6' denotes an etching selectivity ratio of the third mask layer and the second mask layer.

5. The pattern sheet according to claim 4, wherein the second mask layer is a silicon dioxide layer, and/or the third mask layer is an APFα-C layer.

6. A semiconductor intermediate product formed by performing an etching process on the pattern sheet of claim 1, comprising a second mask layer, a dielectric layer, and a substrate sequentially arranged in stacks from top to bottom, wherein:

a thickness of the second mask layer of the semiconductor intermediate product is smaller than a thickness of the second mask layer of the pattern sheet;

the second mask layer includes a second hole penetrating the second mask layer;

the dielectric layer includes a fourth hole arranged corresponding to the second hole and penetrating the dielectric layer; and the substrate includes a fifth hole arranged corresponding to the fourth hole and penetrating the substrate.

7. The semiconductor intermediate product according to claim 6, wherein the etching process is a through silicon via (TSV) etching process.

8. A semiconductor intermediate product formed by performing an etching process on the pattern sheet according to claim 4, comprising a third mask layer, a dielectric layer, and a substrate sequentially arranged in stacks from top to bottom, wherein:

a thickness of the third mask layer of the semiconductor intermediate product is smaller than a thickness of the third mask layer of the pattern sheet;

the third mask layer includes a third hole penetrating the third mask layer;

the dielectric layer includes a fourth hole arranged corresponding to the third hole and penetrating the dielectric layer; and the substrate includes a fifth hole arranged corresponding to the fourth hole and penetrating the substrate.

9. The semiconductor intermediate product according to claim 8, wherein the etching process is a through silicon via (TSV) etching process.

* * * * *